United States Patent
Asano

(10) Patent No.: US 7,982,155 B2
(45) Date of Patent: Jul. 19, 2011

(54) SYSTEM OF TESTING SEMICONDUCTOR DEVICES, A METHOD FOR TESTING SEMICONDUCTOR DEVICES, AND A METHOD FOR MANUFACTURING SEMICONDUCTOR DEVICES

(75) Inventor: Masafumi Asano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/588,685

(22) Filed: Oct. 23, 2009

(65) Prior Publication Data

US 2010/0068833 A1  Mar. 18, 2010

Related U.S. Application Data

(62) Division of application No. 11/373,986, filed on Mar. 14, 2006, now Pat. No. 7,629,550.

(30) Foreign Application Priority Data

Mar. 16, 2005 (JP) ................. P2005-075410

(51) Int. Cl.
B07C 5/344 (2006.01)

(52) U.S. Cl. ......... 209/572; 209/571; 209/573; 702/108

(58) Field of Classification Search .............. 209/571, 209/572, 573; 702/108
See application file for complete search history.

(56) References Cited

U.S. PATENT DOCUMENTS

| | | | |
|---|---|---|---|
| 6,781,363 B2 * | 8/2004 | Chen .................. | 324/754.03 |
| 6,799,130 B2 | 9/2004 | Okabe et al. | |
| 6,885,950 B2 * | 4/2005 | Mitsutake et al. ............ | 702/58 |
| 2003/0014205 A1 * | 1/2003 | Tabor ............................ | 702/84 |
| 2003/0130806 A1 * | 7/2003 | Mizuno et al. ................ | 702/35 |
| 2004/0267477 A1 | 12/2004 | Scott et al. | |
| 2005/0119850 A1 | 6/2005 | Asano | |
| 2006/0085155 A1 * | 4/2006 | Miguelanez et al. ......... | 702/118 |

FOREIGN PATENT DOCUMENTS

| | | |
|---|---|---|
| JP | 2002-231911 | 8/2002 |
| JP | 2003-329741 | 11/2003 |
| JP | 2004-012365 | 1/2004 |
| JP | 2004-296676 | 10/2004 |
| JP | 2005-175052 | 6/2005 |

OTHER PUBLICATIONS

Notification of Reasons for Refusal issued by the Japanese Patent Office on Apr. 13, 2010, for Japanese Patent Application No. 2005-075410, and English-language translation thereof.

Asano et al., "Sampling Plan Optimization for CD Control in Low $k_1$ Lithography," Metrology, Inspection, and Process Control for Microlithography XIX, Proc. of SPIE (May 2005), 5752:727-735.

Notification of Reasons for Refusal issued by the Japanese Patent Office on Feb. 15, 2011, for Japanese Patent Application No. 2005-075410, and English-language translation thereof.

* cited by examiner

Primary Examiner — Terrell H Matthews
(74) Attorney, Agent, or Firm — Finnegan, Henderson, Farabow, Garrett & Dunner, L.L.P.

(57) ABSTRACT

A system of testing semiconductor devices includes a classification module configured to classify a plurality of lots into a plurality of groups; an apparatus assignment module configured to assign a plurality of testing apparatuses to each of the groups; and a test recipe creation module configured to create a test recipe to test defects in a second group other than a first group specified in the groups, the test recipe including a definition of testing positions in the second group defined by a rule different from the first group.

7 Claims, 7 Drawing Sheets

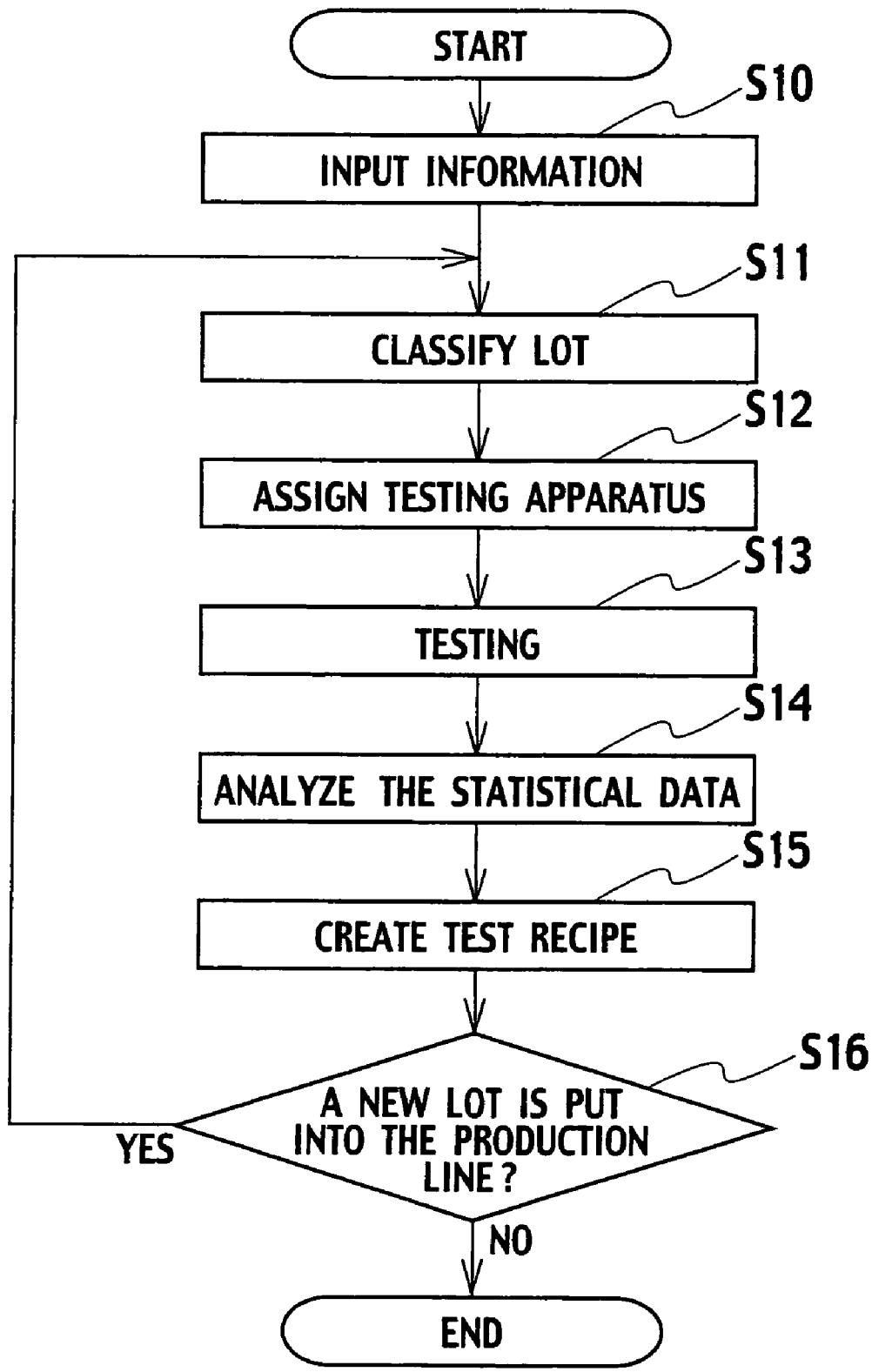

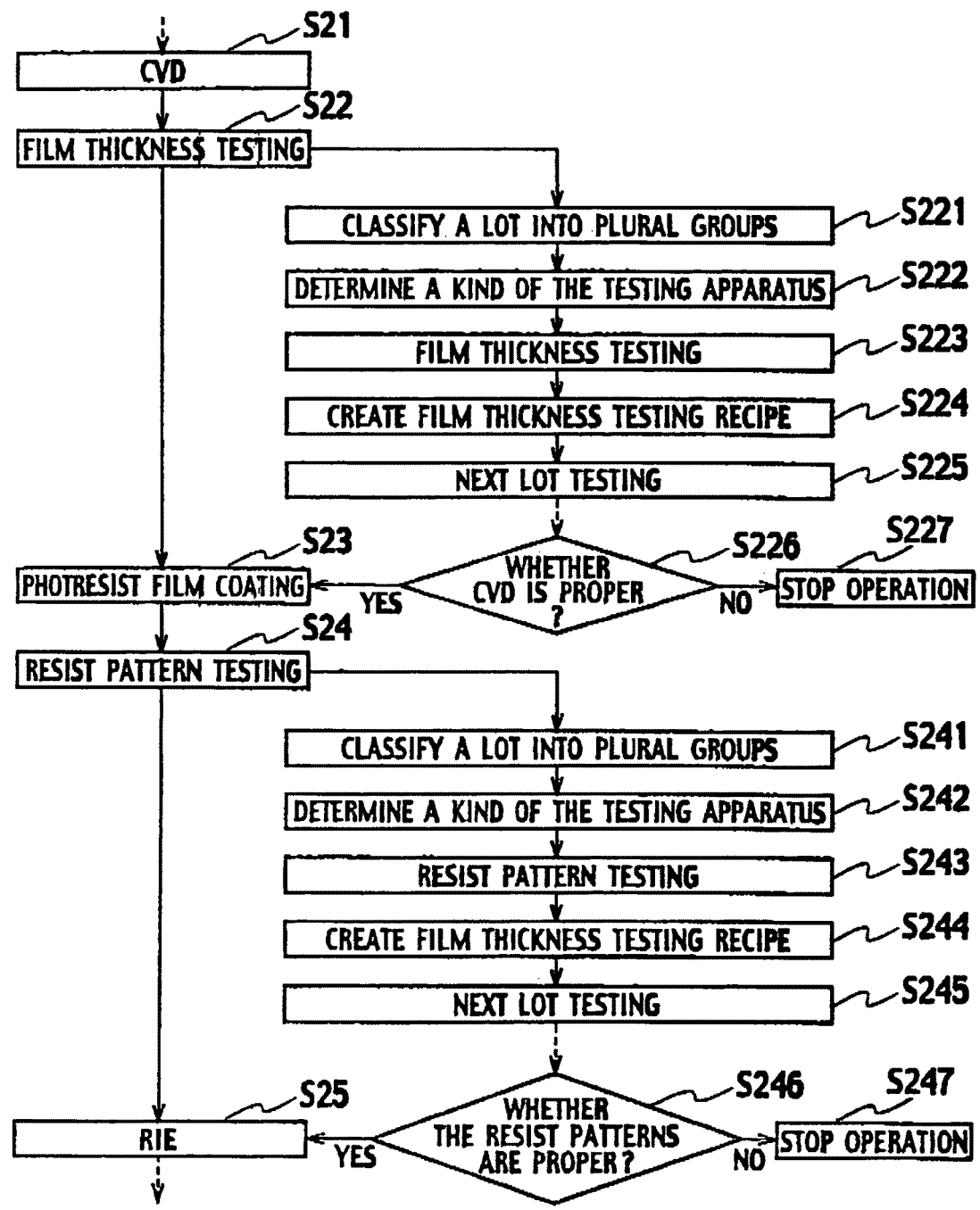

SYSTEM OF TESTING SEMICONDUCTOR DEVICES, A METHOD FOR TESTING SEMICONDUCTOR DEVICES, AND A METHOD FOR MANUFACTURING SEMICONDUCTOR DEVICES

CROSS REFERENCE TO RELATED APPLICATIONS AND INCORPORATION BY REFERENCE

This is a division of application Ser. No. 11/373,986, filed Mar. 14, 2006 now U.S. Pat. No. 7,629,550, which is incorporated herein by reference.

This application is based upon and claims the benefit of priority from the prior Japanese Patent. Applications No. P2005-75410, filed on Mar. 16, 2005; the entire contents of which are incorporated herein by reference.

BACKGROUND OF THE INVENTION

1. Field of the Invention

The present invention relates to a testing system, more specifically to a testing system for testing semiconductor devices, a testing method for testing semiconductor devices, and a method for manufacturing semiconductor devices.

2. Description of the Related Art

A semiconductor device is manufactured by a series of processes including a combination of lithography, etching, heat treatment (oxidation, annealing, or diffusion), ion implantation, thin film formation (CVD, sputtering, or vapor deposition), washing (resist removal or washing with a solution), or the like. After the treatment of each process, testing is carried out to check adequacy of the treatment, magnitude of variation, and the like. For example, in the lithography process to transfer an image of a mask pattern to a working wafer, dimensional measurement of the transferred pattern is performed.

In the testing process, sampling test is performed. Specifically, in a lot including a plurality of semiconductor wafers, some semiconductor wafers are sampled and then tested. Results of the testing are considered as representative values of the lot. The sampling test in the testing process is to save time and effort required for the 100-percent-testing. However, along with a recent increase in integration of semiconductor devices, each process becomes difficult to control, and the number of items to be tested is getting larger than before. For example, the dimensional measurement after the lithography requires monitoring of variation in a shot, variation between shots, variation between wafers, and the like.

In currently-available method of testing, areas to be tested are previously decided. Accordingly, it is difficult to coverall the test items within the limited number of tests. For example, when the number of testing points determined on a throughput of a testing apparatus or costs is limited to 30 points, the test items are determined as: five points per shot, six shots per wafer, and one wafer per lot. The variation in a shot and variation between shots, for which many tests are carried out, can be monitored. However, the variation between wafers cannot be monitored since only one wafer is measured. However, since wafers are varied, the representative values of the lot cannot be properly calculated by sampling only one wafer from the lot.

SUMMARY OF THE INVENTION

An aspect of the present invention inheres in a system of testing semiconductor devices, encompassing a classification module configured to classify a plurality of lots into a plurality of groups; an apparatus assignment module configured to assign a plurality of testing apparatuses to each of the groups; and a test recipe creation module configured to create a test recipe to test defects in a second group other than a first group specified in the groups, the test recipe including a definition of testing positions in the second group defined by a rule different from the first group.

Another aspect of the present invention inheres in a method of testing semiconductor devices, encompassing classifying a plurality of lots into a plurality of groups; assigning a plurality of testing apparatuses to the groups, respectively; and creating a test recipe to test defects in a second group other than a first group specified in the groups, the test recipe including a definition of testing positions defined by a rule different from the first group.

Still another aspect of the present invention inheres in a method of manufacturing semiconductor devices, encompassing conducting a manufacturing procedure on a plurality of working substrates implementing one of a plurality of lots; classifying the lots into a plurality of groups; assigning a plurality of testing apparatuses to the groups respectively; creating a test recipe to test defects in a second group other than a first group in the groups, the test recipe including a definition of testing positions defined by a rule different from the first group; and testing defects in the second group based on the test recipe.

BRIEF DESCRIPTION OF DRAWINGS

FIG. 5 is a flowchart illustrating a testing method of the testing system according to the embodiment of the present invention;

FIG. 6 is a flowchart illustrating a method of manufacturing semiconductor devices according to the embodiment of the present invention.

DETAILED DESCRIPTION OF THE INVENTION

Figure 1:
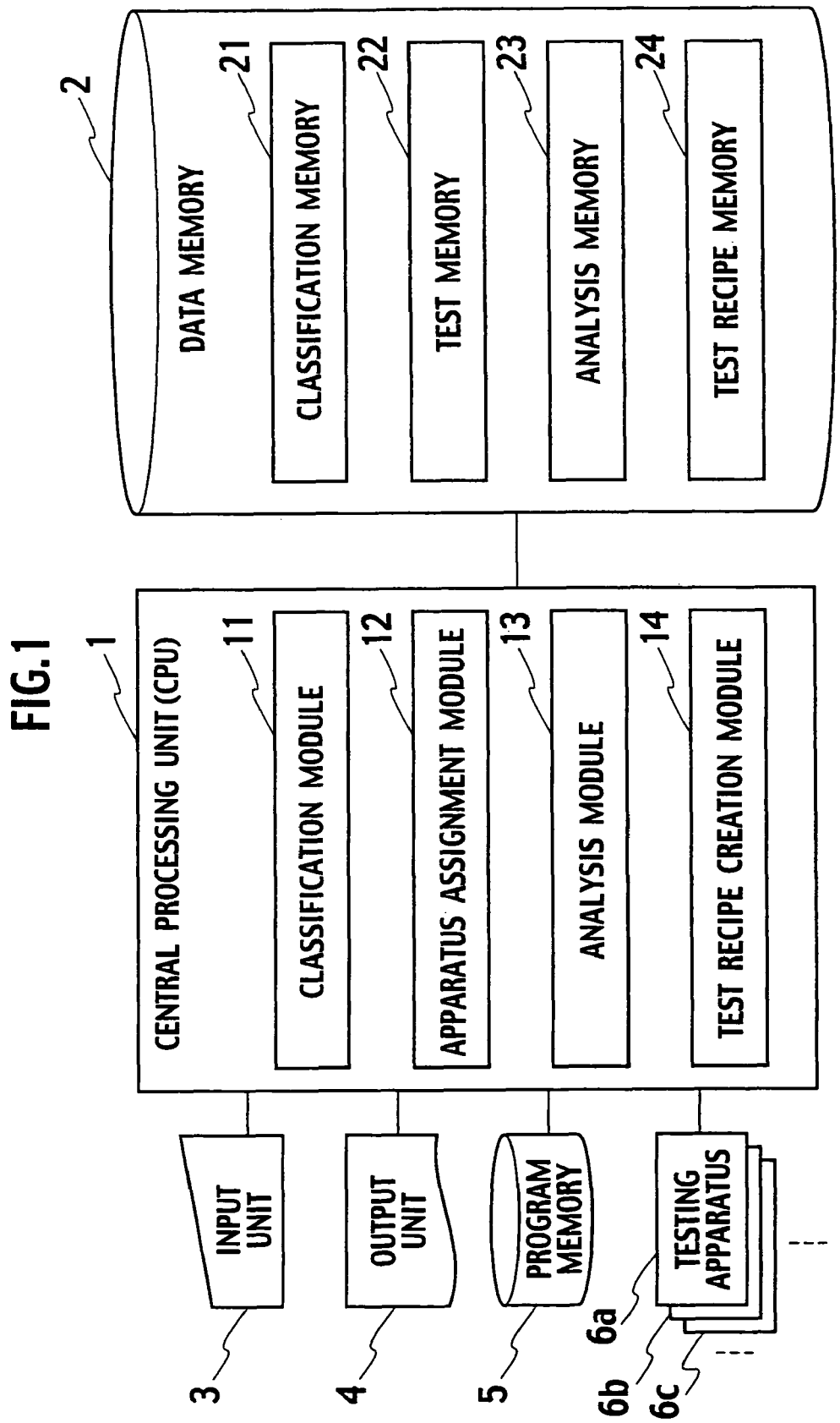
FIG. 1 is a block diagram illustrating a testing system for testing semiconductor devices according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. In the following descriptions, numerous details are set forth such as specific signal values, etc. to provide a thorough understanding of the present invention. However, it will be obvious to those skilled in the art that the present invention may be practiced without such specific details.

First Embodiment

As shown in FIG. 1, a system for testing semiconductor devices according to an embodiment of the present invention includes a classification module 11, an apparatus assignment module 12, and a test recipe creation module 14. The classification module 11 classifies a plurality of lots into a plurality of groups. The apparatus assignment module 12 assigns an testing apparatus 6a, 6b, 6c, ..., to each of the groups. The test recipe creation module 14 creates a test recipe based on testing results from the testing apparatus 6a, 6b, 6c, ....

The classification module 11, the apparatus assignment module 12, and the test recipe creation module 14 implement as a part of a central processing unit (CPU) 1 of a computer system as shown in FIG. 1. The CPU 1 further includes an analysis module 13 to analyze the testing results from the testing apparatuses 6a, 6b, 6c, .... The classification module 11, the apparatus assignment module 12, the analysis module 13, and the test recipe creation module 14 may be each established by dedicated hardware and connected to each other through LAN or the like.

The testing apparatuses 6a, 6b, 6c, ... are connected to the CPU 1. The CPU 1 is connected to a data memory 2 storing processing results of the CPU 1 and the like, an input unit 3 accepting an input from an operator and the like, an output unit 4 outputting the processing results of the CPU 1 and the like, and a program memory 5 storing various programs necessary for arithmetic processing of the CPU 1.

The classification module 11 classifies a plurality of lots including a plurality of working substrates into a plurality of groups for each lot. Herein, the working substrates may indicate semiconductor substrates (semiconductor wafers) in manufacture of semiconductor devices, liquid-crystal substrates in manufacture of liquid-crystal devices, resin substrates in manufacture of magnetic or optical recording media, magnetic substrates in manufacture of thin-film magnetic heads, piezoelectric substrates in manufacture of ultrasonic devices, or intermediate products at an intermediate phase of a manufacturing process in manufacture of superconducting devices, such as superconducting substrates.

The working substrates can be formed of organic materials such as various kinds of synthetic resin or various inorganic materials such as semiconductors, metal, ceramic, and glass depending on a kind of the object product (manufactured product). Many of the working substrates are plate-shaped bases, which may be referred to as "manufactured substrates", like semiconductor wafers. However, the working substrates are unnecessarily plate-shaped and can have various shapes such as a block shape depending on the kind of the object product (manufactured product). In the case of the manufacturing with the semiconductor wafers and the like, intermediate products including a composite structure with a semiconductor wafer, as a base material, and thin films laminated on the semiconductor wafer are also referred to as the "working substrates".

Figure 2:
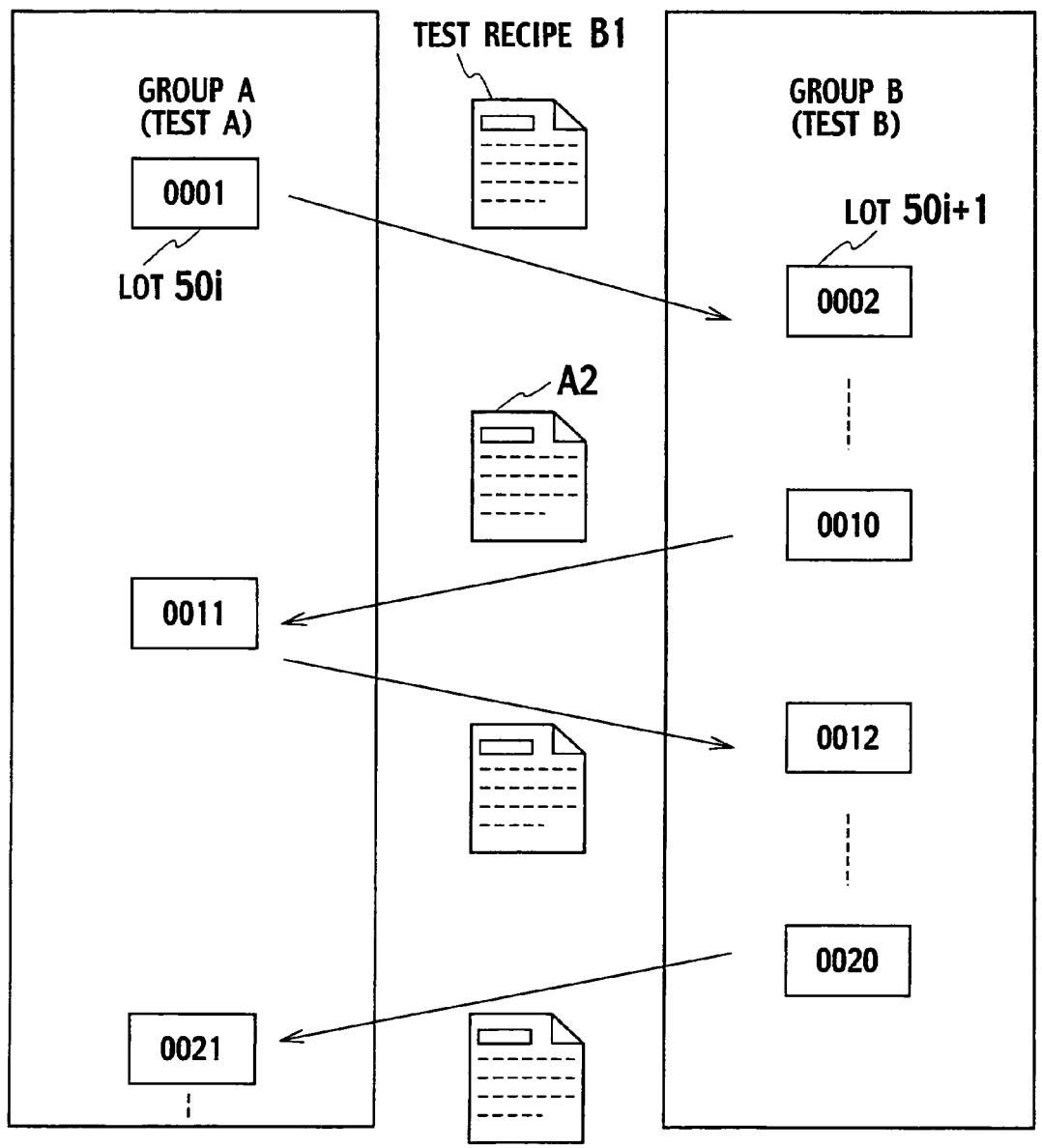
FIG. 2 is a schematic diagram illustrating an example of a method of classifying lots of the testing system according to the first embodiment of the present invention.

The classification module 11 automatically classifies lots into a plurality of groups based on identification numbers_N attached to the lots as shown in FIG. 2. Specifically, the classification module 11 classifies, for example, a lot with the identification number N with final number of "1" as a "first group A" and classifies a lot with the identification number N with final number other than "1" as "a second group B". Specifically, lots with the identification numbers N of "0001", "0011", and "002.1" belong to the first group (group A), and lots with the identification numbers N of "0002" to "0010" and "0012" to "0020" belong to the second group (group B).

The apparatus assignment module 12 of FIG. 1 selects a suitable kind of the testing apparatus 6a, 6b, 6c, ... according to the test recipes of the first and second groups. The testing apparatuses 6a, 6b, 6c, ... tests of dimensions of patterns, thickness of thin films, resistance of diffusion layers, polysilicon layers, and the like on working substrates (wafers) included in lots put into a production line. The testing apparatuses 6a, 6b, 6c, ... can be various types of testing apparatuses and measurement apparatuses such as a microscope, an interference-type film thickness gauge, an ellipsometer, a contact-type film thickness gauge, and a resistance meter. The analysis module 13 analyzes statistical data including an average, a maximum value, a minimum value, variation, and the like of the testing results obtained by the testing apparatuses 6a, 6b, 6c, ....

The test recipe creation module 14 creates a test recipe of a subject group to be tested next to the previous group, based on the analysis information of the previous group measured by the analysis module 13. Herein, a description is given taking measurement of linewidth of resist patterns after lithography as an example.

Figure 3A:
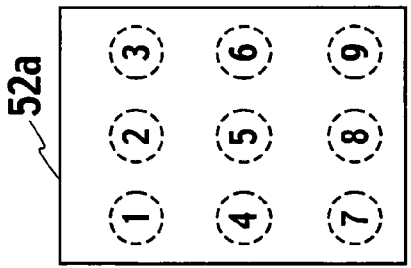
FIG. 3A is a schematic diagram illustrating a lot belong to a GROUP A in FIG. 2.
Figures 3B, 3C:
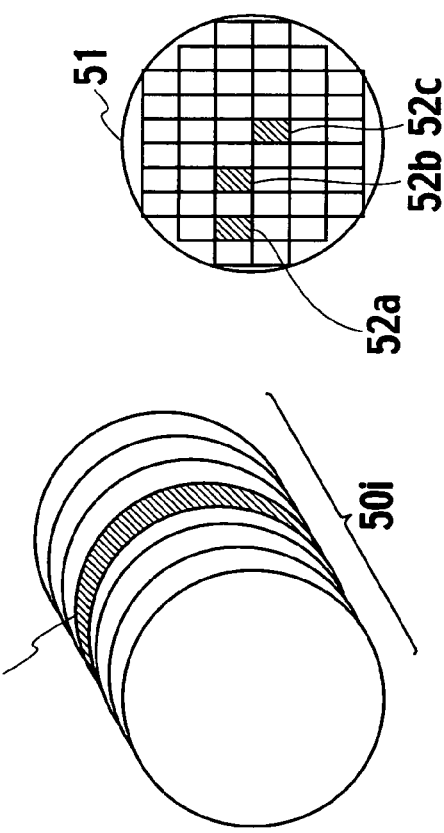
FIG. 3B is a schematic diagram illustrating measurement points (shots) included in a wafer.
FIG. 3C is a schematic diagram illustrating measurement points (sites) included in the shot as shown in FIG. 3B.
Figure 3D:
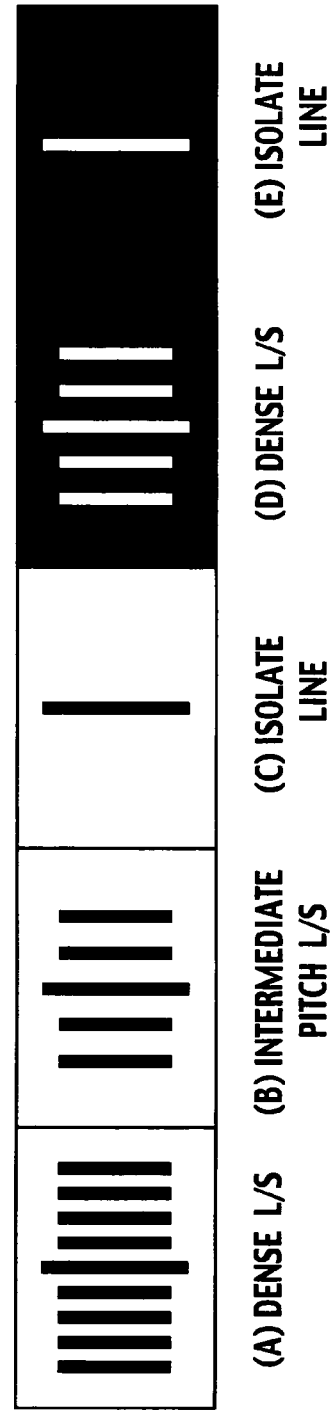
FIG. 3D is a schematic diagram illustrating an example of a kind of a pattern included in the cite as shown in FIG. 3C.

Lot variation in linewidth after lithography includes, for example, variation between a plurality of wafers constituting a lot 50, shown in FIG. 3A, variation between shots when each wafer is divided into a plurality of areas (shots) shown in FIG. 3B, variation between sites when each shot is divided into a plurality of small areas (sites) shown in FIG. 3C, and variation between patterns (A) to (E) formed in each sites shown in FIG. 3D.

In order to focus on testing of the variations between sites shown in FIG. 3C and variation between patterns shown in FIG. 3D, far the first group (group A) in FIG. 2, for example, the test recipe creation module 14 creates a test recipe so as to increase the number of tests shown in FIGS. 3C and 3D. On the other hand, for the second group (group B) in FIG. 2, the test recipe creation module 14 creates a test recipe so as to increase the number of tests shown in FIGS. 3A and 3B, in order to focus on testing of the variation between wafers shown in FIG. 3A and variation between shots shown in FIG. 3B.

Specifically, in a test recipe A1 (not shown) belonging to the first group (group A), as shown in FIG. 3A, a wafer 51 is arbitrarily extracted from the lot $50_i$. Furthermore, as shown in FIG. 3B, three shots 52a, 52b, and 52c™ are extracted from the wafer 51. As shown in FIG. 3C, nine sites are extracted from each of the shots 52a to 52c. Measurement is performed for dimensions of, for example, five pattern shapes shown in FIG. 3O included in each of the nine sites, specifically, (A) dense lines and spaces (L/S), (B) intermediate pitch lines and spaces (L/S), (C) an isolated line, (D) dense lines and spaces of a reversed pattern, and (E) an isolated line of the reversed pattern.

Figure 4B:
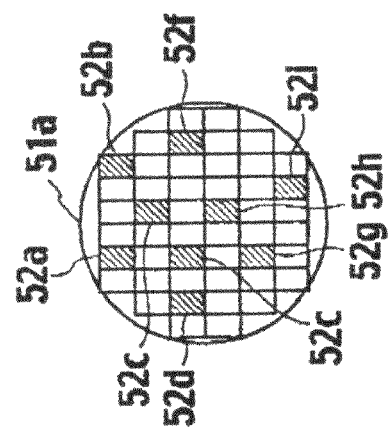
FIG. 4B is a schematic diagram illustrating measurement points (shots) included in a wafer.
Figure 4D:
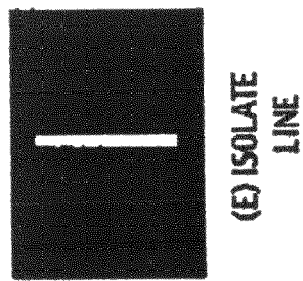
FIG. 4D is a schematic diagram illustrating an example of a kind of a pattern included in the cite as shown in FIG. 4C.
Figure 4A:
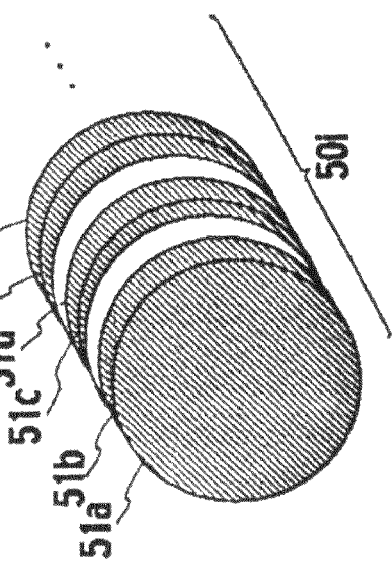
FIG. 4A is a schematic diagram illustrating an example of measurement subjects of wafers belong to the GROUP B in FIG. 2.
Figure 4C:
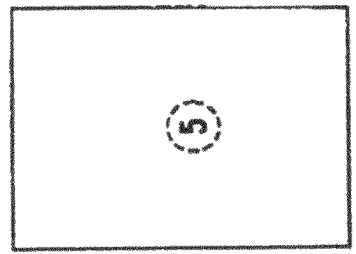
FIG. 4C is a schematic diagram illustrating measurement points (sites) included in the shot as shown in FIG. 4B.

On the other hand, in a test recipe when a lot $50_{i+1}$ belonging to the second group (group B) is tested, as shown in FIG. 4A, six wafers 51a to 51f are extracted from the lot $50_{i+1}$. As shown in FIG. 4B, nine shots 52a to 52i set in each of the wafers 51a to 51f are extracted. As shown in FIG. 4C, a site "5" is extracted from each of the shots 52a to 52i. Measurement is then performed for linewidth of the pattern shape (E) of FIG. 4D existing in each site "5".

The data memory 2 of FIG. 1 includes classification memory 21, a test memory 22, an analysis memory 23, and a test recipe memory 24. The classification memory 21 stores results of group classification of each lot performed by the classification module 11. The test memory 22 stores information of the testing apparatuses 6a, 6b, 6c, . . . determined by the apparatus assignment module 12. The analysis memory 23 stores analysis information of the analysis module 13. The test recipe memory 24 stores the test recipes created by the test recipe creation module 14.

The input unit 3 shown in FIG. 1 includes a keyboard, a mouse, a light pen, a flexible disk, or the like. The operator can perform specification of input/output data, setting of test or analysis conditions or the like, and the like through the input unit 3. The output unit 4 can be a display, a printer, a recording apparatus saving in a computer-readable recording medium, or the like. Examples of the computer-readable recording medium include a computer external memory, a semiconductor memory, a magnetic disk, an optical disk, a cassette tape, and an open reel tape.

With the testing system shown in FIG. 1, in a series of lots put into the production line, each group is subjected to different kinds of test using different testing apparatuses with a same number of tests. Accordingly, it is possible to obtain accurate representative values of a lot even when many test items are included in the lot. Furthermore, the classification module 11 automatically classifies lots into a plurality of groups based on the identification numbers attached to the lots, so that the production line can be automated.

Next, a description is given of a method of testing semiconductor devices using the system according to the embodiment with reference to a flowchart of FIG. 5. Herein, the description is given of an example in which a process to measure linewidth of resist patterns after lithography is applied to the testing system.

In step S10 of FIG. 5, various types of information including test recipes, types of the testing apparatuses, group classification information to classify a plurality of lots into a plurality of groups, and test items for each group are input through the input unit 3 and stored in the data memory 2. Herein, for example, the classification memory 21 stores information to, based on the identification numbers N of lots, classify lots having the identification numbers N with final number of "1" as the first group (group A) and classify lots having the identification numbers N with final number other than "1" as the second group (group B). As the test recipe A1 of the first group (group A), as shown in FIGS. 3A to 3D, the test recipe memory 24 stores information to measure five pattern shapes of nine sites of three shots in one wafer.

In step S11, the classification module 11 reads the group classification information stored in the classification memory 21. The classification module 11 automatically classifies a lot put into the production line based on the identification number N attached to the lot as the first group (group A) or the second group (group B). For example, when the lot $50_i$ with the identification number N of "0001" is put into the production line, the classification module 11 classifies the lot $50_i$ into the first group (group A) based on the group classification information. The result of group classification of the lot $50_i$ is stored in the classification memory 21.

In step S12, the apparatus assignment module 12 reads the result of group classification of the lot $50_i$ from the classification memory 21. The apparatus assignment module 12 reads the test recipe A1 from the test recipe memory 24 and assigns a suitable kind of the testing apparatus 6a, 6b, 6c, . . . according to the test recipe A1 and the result of group classification of the lot $50_i$. For example, the lot $50_i$ belongs to the first group (group A). The test recipe of the group A is targeted for dimensional measurement of minute regions of various areas in one wafer. Accordingly, as the testing apparatus 6a, a scanning electron microscope suitable for the dimensional measurement of minute regions is selected. The result of selection of the testing apparatus 6a is stored in the test memory 22.

In step S13, the testing apparatus 6a reads the test recipe A1 stored in the data memory 2. Based on the test recipe A1, the testing apparatus 6a extracts the wafer 51 from the lot $50_i$, extracts the three shots 52a to 52c from the wafer 51, and tests dimensions of linewidth of the five pattern shapes (A) to (E) of each of the nine sites existing in each shot. The results of testing of the testing apparatus 6a are transmitted to the analysis module 13.

In step S14, based on the result of test of the lot $50_i$ transmitted from the testing apparatus 6a, the analysis module 13 analyzes the statistical data including a maximum value, a minimum value, an average, variation, and the like of each measured minute dimension. In the sites 1 to 9 shown in FIG. 3C, the analysis module 13 analyzes a position of a site providing a dimension averaged over pattern shapes ((A) to (E)) closest to a predetermined target dimension. The analysis module 13 analyzes a, pattern shape providing dimension closest to the target dimension in the pattern shapes (A) to (E) shown in FIG. 3D. The analysis information by the analysis module 13 is stored in the analysis memory 23.

In step S15, the test recipe creation module 14 reads the analysis information stored in the analysis memory 23. Based on the read analysis information, the test recipe creation module 14 creates a test recipe B1 of a group to be tested next. For example, in the test of the lot $50_i$ belonging to the first group (group A), suppose that the test recipe creation module 14 obtains the analysis information that the dimension average of the site 5 shown in FIG. 3C is closest to the target dimension and the dimension of the pattern shape (E) shown in FIG. 3O is closest t the target dimension. In order to focus on test of the variation between the plurality of wafers and variation in a wafer, the test recipe creation module 14 creates the test recipe B1 so that the number of tests in each shot is fixed to one point (the pattern shape (E) in the site 5 is tested) and the number of tests for the variation between wafers and variation in a wafer is increased. The created test recipe B1 is stored in the test recipe memory 24.

In step S16, it is judged whether a next lot is put into the production line. When the next lot is put into the production line, the procedure proceeds to the step S11. In the step S11, the classification module 11 reads the group classification information stored in the data memory 2 and, based on the identification number N "0002" of the new lot $50_{i+1}$, classifies the lot $50_{i+1}$ as the group B. The result of group classification of the lot $50_{i+1}$ is stored in the classification memory 21.

In the step S12, the apparatus assignment module 12 reads the group type of the lot $50_{i+1}$ from the classification memory 21. The lot $50_{i+1}$ belongs to the second group (group B), and the apparatus assignment module 12 reads the test recipe B1 from the test recipe memory 24 and assigns a suitable kind of the testing apparatus 6a, 6b, 6c, . . . according to the test recipe B1. Herein, an object of the test recipe B1 is to test a large number of wafers with the testing position fixed. Accordingly, as the testing apparatus 6b, an optical dimension gauge such as a scatterometry is selected. The result of selection of the testing apparatus 6b is stored in the test memory 22.

In the step S13, the testing apparatus 6b reads the test recipe B1 stored in the data memory 2. Based on the test recipe B1, the testing apparatus 6b samples the six wafers 51a to 51f shown in FIG. 4A out of the lot $50_{i+1}$ and selects the nine shots 52a to 52i from each of the wafers 51a to 51f. The testing apparatus 6b then tests the dimension of the pattern shape (E) in one site existing in each shot. The result of tests by the testing apparatus 6b is transmitted to the analysis module 13.

In the step S14, the analysis module 13 analyzes the results of tests by the testing apparatus 6b transmitted from the testing apparatus 6b. In the step S15, based on the analysis information by the analysis module 13, the test recipe creation module 14 creates a new test recipe to test a next group and causes the test recipe memory 24 to store the new test recipe. For all the lots put into the production line, testing shown in the steps S11 to S15 are repeated for each group classified based on the identification numbers N.

The measurement of linewidth in the testing process after lithography includes two objects of: (1) obtaining exposure conditions of the next lot from the measurement results; and (2) not transmitting a defective lot to the subsequent process.

In the testing method using the testing system according to the embodiment, first, in the testing of the lot $50_i$ (identification number N: "0001") classified as the group A, the wafer 51 is sampled from the lot $50_i$, and measurements are performed for the dimensions of the sites existing in the shots 52a to 52c and the dimensions of the pattern shapes. By the measurement, the variation in a shot and the variation between patterns of the lot $50_i$ are obtained. However, in the test items of the first group (group A), only the wafer 51 is tested, and the variation between wafers is not known.

Accordingly, in the testing of the lots (identification number N: "0002"-"0010") classified as the second group (group B) to be tested next, based on the test recipe B1 created at the test of the group A, the numbers of wafers and shots sampled are increased. As shown in FIGS. 4A to 4D, the wafers 51a to 51f are sampled from the lot $50_{i+1}$, and the shots 52a to 52i are sampled from each wafer. This makes it possible to analyze which of the wafers 51a to 51f is subject to defects or which location in the wafers 51a to 51f is subject to defects.

When the analysis results of the group B reveal that the linewidth of the first wafer 51a shown in FIG. 4A tends to be narrowed and the linewidth around the center of the wafer 51a tends to be narrowed, the analysis results of the group B is reflected on a test recipe. A2 of a group to be tested next. Accordingly, in the test of a lot (identification number N; "0011") classified as the group A next tested as shown in FIG. 2, it is possible to extract and test many linewidth around the center of the first wafer, which tend to be narrowed, thus providing accurate lot averages.

As described above, by reflecting the test recipe based on the analysis information obtained for each group on testing of the next group, the two aforementioned objects of the dimensional measurement after lithography can be satisfied. It is therefore possible to provide the testing system effective on controlling wafer linewidth.

Next, a description is given of a method of manufacturing a semiconductor device according to the embodiment with reference to a flowchart shown in FIG. 6. The flowchart of FIG. 6 shows a part of a vast and complicated semiconductor device manufacturing process, specifically, a CVD process in S21, a film thickness testing process S22, a photoresist film formation process in step S23, and a resist pattern testing process in step S24. There are certainly a series of processes corresponding before the step S21 and a series of processes corresponding after step S28. The flowchart shown in FIG. 6 is just an example, and the embodiment can be applied to various testing processes including a modification of this example.

In the step S21, insulating films such as thermal oxidized films are grown on wafers by CVD. In the step S22, film thickness of the insulating films formed on the wafers is tested. Specifically, in step S221, the classification module 11 of FIG. 1 classifies lots put into the production line into a plurality of groups based on the identification numbers N attached to the respective lots.

In step S222, the apparatus assignment module 12 selects a kind of the testing apparatus 6a, 6b, 6c, . . . suitable for the film thickness testing based on the test recipe stored in the data memory and group classification information.

In step S223, the testing apparatus 6a, 6b, 6c, . . . reads the test recipe stored in the data memory 2 and measures the film thickness on the wafer. The results of the film thickness testing is transmitted to the analysis module 13, and the analysis module 13 analytes the statistical data including an average, a maximum value, a minimum value, variation, and the like of the film thickness.

In step S224, the test recipe creation module 14 creates a film thickness test recipe of a group to be tested next based on statistical data obtained from the analysis information of the analysis module 13, such as film thickness defects. In step S225, the process shown in the aforementioned steps S221 and 224 is repeated again based on the identification number N attached to the next lot.

In step S226, when the test of all the lots is finished, it is determined whether the CVD process of the step S21 is properly performed. When the CVD process is determined not to be properly performed, the operation is stopped in step S227. When the CVD process is determined to be properly performed, the procedure proceeds to the step S23.

In the step S23, photoresist films are applied on the surfaces of the insulating films on the wafers by a photolithographic technique. Thereafter, in the step S24, patterns of the formed photoresist films are tested. Specifically, in step S241, the classification module 11 classifies the lots put into the production line into a plurality of groups based on the identification numbers N attached to the lots.

In step S242, the apparatus assignment module 12 selects a kind of the testing apparatus 6a, 6b, 6c, . . . suitable for the dimensional measurement based on the test recipe stored in the data memory and group classification results.

In step S243, the testing apparatus 6a, 6b, 6c, . . . reads information of the test recipe for resist patterns stored in the data memory 2 and measures dimensions of the resist patterns formed on the wafers. The results of the dimensional measurement is transmitted to the analysis module 13, and the analysis module 13 analyzes statistical data including an average, a maximum value, a minimum value, and a variation of dimensions of the patterns for each testing area.

In step S244, the test recipe creation module 14 creates a test recipe for resist patterns of a group to be tested next, based on information of dimensional defects of the resist patterns obtained from the analysis information of the analysis module 13.

In step S245, according to the conditions of the group decided based on the identification number N attached to the next lot, the dimensional measurement of the resist patterns shown in the steps S241 to S244 is repeated. After the testing for all the lots is finished, in step S246, it is determined whether the formation of the resist patterns is properly performed. When the formation is determined not to be properly performed, the procedure proceeds to step S247, and the operation is stopped. When the formation is determined to be properly performed, the procedure proceeds to the step S25, and an etching (RIE) process is performed.

With the semiconductor device manufacturing method as shown in FIG. 6, the plurality of lots are automatically classified according to the identification numbers N, and a predetermined test based on the test recipe is performed for each classified group. In the test recipe, the testing object is determined based on the defect information obtained from the testing results of each group. As the testing proceeds, more accurate test recipes can be created. It is therefore possible to detect defects of the semiconductor devices with higher accuracy.

(Modification)

Figure 7:
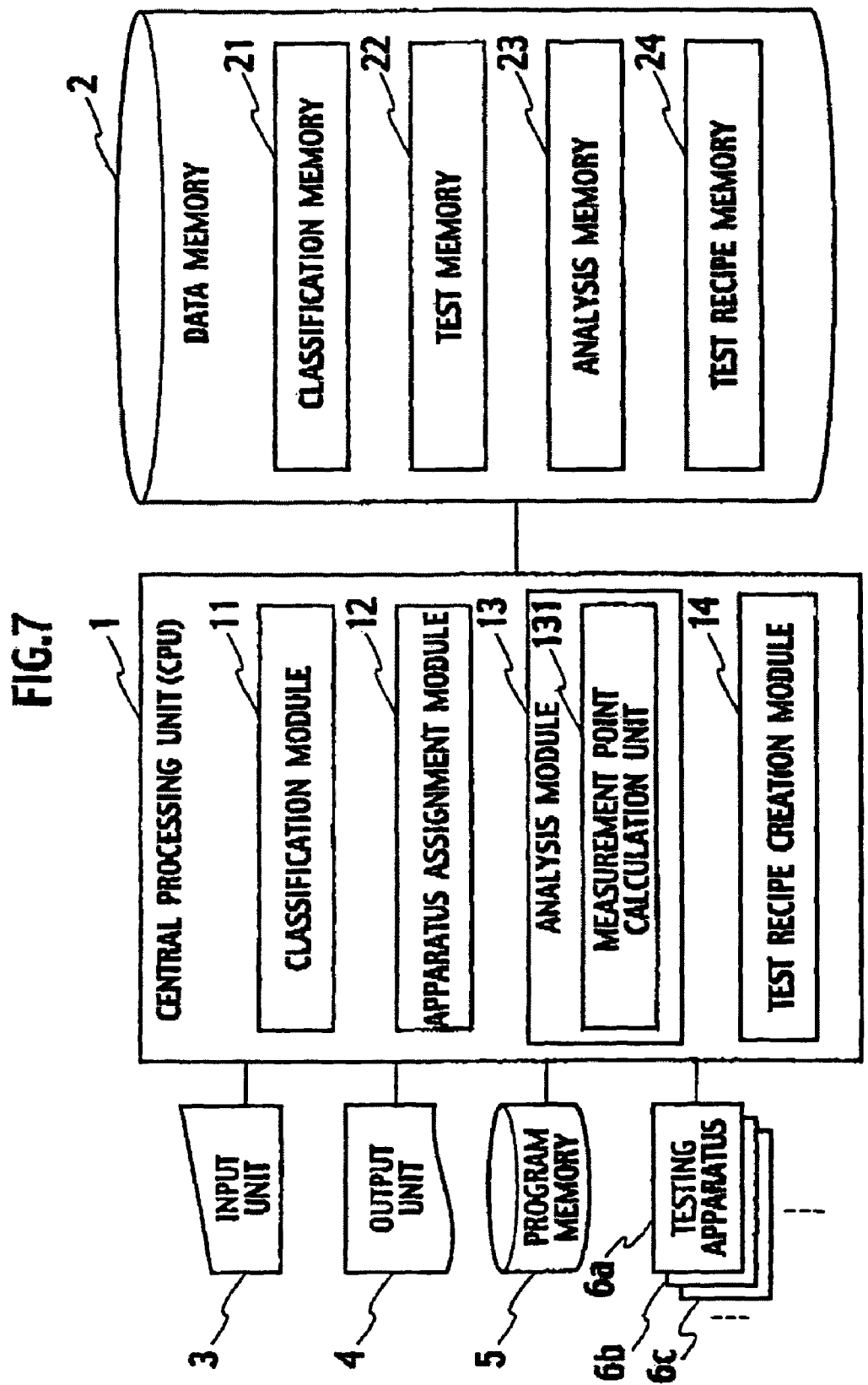
FIG. 7 is a block diagram illustrating a testing system according to a modification of the present invention.

As shown in FIG. 7, a system of testing semiconductor devices according to a modification of the embodiment is different from the testing system shown in FIG. 1 in that the analysis module 13 includes a measurement point calculation unit 131. The classification module 11, the apparatus assignment module 12, the analysis module 13, and the test recipe creation module 14 may be constituted as a part of the CPU 1 of a computer system or may be separately composed of dedicated hardware to be connected through LAN or the like.

The classification module 11 shown in FIG. 7 classifies lots having the identification numbers N followed by "30(n+1)+1" (n is an integral number not less than 1) as a group A and the other lots as a group B. In other words, the classification module 11 classifies one lot as the group A per 30 lots. The apparatus assignment module 12 selects test items about the variation between patterns and variation between shots for the group A. The apparatus assignment module 12 selects test items about the variation between sites and variation between wafers, which are not tested in the group A.

The testing apparatus 6a, 6b, 6c, . . . tests lots put into the production line based on information of the testing apparatus information transmitted from the test memory 22 and the test recipe stored in the data memory 2. For example, when there are 25 wafers included in one lot, 80 shots per one wafer, nine sites per one shot, and 10 type of pattern shapes per one site, the total numbers of patterns included in one lot is 180000. The testing apparatus 6a, 6b, 6c, . . . measures linewidth of total 10800 patterns of 6 wafers×20 shots×9 sites×10 patterns for the lot $50_i$ with the identification number N of "0001", which belongs to the group A. For the testing apparatus 6a, 6b, 6c, . . . capable of measuring 10800 patterns at high speed, an optical measurement apparatus such as a scatterometry is suitable. In the case of using the scatterometry as the testing apparatus 6a, 6b, 6c, . . . , when measurement time per one point is about 2.5 seconds, it takes 7.5 hours to measure 10800 patterns.

The measurement point calculation unit 131 analyzes standard deviations ($\sigma_p$, $\sigma_s$, $\sigma_f$, $\sigma_w$) of a variation p between patterns, a variation s in a shot, a variation f in a wafer, and a variation w between wafers based on the testing results from the testing apparatus 6a, 6b, 6c, . . . to calculate a sampling number Nw of wafers, a sampling number Nf of shots, a sampling number Ns in a shot, and a sampling number Np of patterns of lots of the group B to be next tested using the following expression.

$$Nw = \{(\sigma_w^2 * N)/(\sigma_f^2 * \sigma_s^2 * \sigma_p^2)\}^{1/4} \quad (1)$$

$$Nf = \{(\sigma_f^2 * N)/(\sigma_w^2 * \sigma_s^2 * \sigma_p^2)\}^{1/4} \quad (2)$$

$$Ns = \{(\sigma_s^2 * N)/(\sigma_w^2 * \sigma_f^2 * \sigma_p^2)\}^{1/4} \quad (3)$$

$$Np = \{(\sigma_p^2 * N)/(\sigma_w^2 * \sigma_f^2 * \sigma_s^2)\}^{1/4} \quad (4)$$

Herein, N is a total number of sampling points (N=Nw·Nf·Ns·Np). The analysis module 13 calculates the sampling numbers Nw, Nf, Ns, and Np when the total sampling number N of each lot of the group B to be next tested is 120. The measurement time when the total sampling number N is 120 is 300 seconds in the case of using a scatterometry or the like whose measurement time per one point is 2.5 seconds as the testing apparatus 6a, 6b, 6c, . . . . The test recipe creation module 14 of FIG. 7 creates a test recipe 60 including testing areas, the kind of the testing apparatus, the sampling numbers Nw, Nf, Ns, and Np, and the like.

When the variations ($\sigma_p$, $\sigma_s$, $\sigma_f$, $\sigma_w$) in each lot are normally distributed, a confidence interval of a population mean in each lot belonging to the group B is proportional to a coefficient A $\{(Nw/\sigma_p^2)+(Nf/\sigma_s^2)+(Nf/\sigma_z^2)+(Nw/\sigma_w^2)\}^{1/2}$. Herein, when the total sampling number N is fixed to a constant value, the confidence interval of the population mean is minimized by the coefficient A, and the estimation accuracy of lot averages of the group to be tested next is increased. Consequently, the number of tests are optimized so as to increase the estimation accuracy of the lot average of the next group, and it is therefore possible to efficiently obtain reliable lot representative values in a short time.

Other Embodiments

Various modifications will become possible for those skilled in the art after receiving the teachings of the present disclosure without departing from the scope thereof.

In the aforementioned testing system, the testing system based on a lot composed of a plurality of wafers is shown. However, it is obvious that this testing system can be applied to a testing system based on a wafer including a number of measurement points.

The present invention is not limited to wafers for use in semiconductor devices but is certainly available in a manufacturing process of other manufactured products in which some samples are taken out from a population for testing, for example, such as manufacturing processes of liquid crystal devices, magnetic recording media, optical recording media, thin film magnetic heads, and super-conducting elements. For example, the manufacturing process of the thin film magnetic heads includes less steps but includes repetition of a CVD process, photolithography process, etching process, and the like similar to semiconductor integrated circuits, and it is therefore easily understood that the testing method of the present invention, is applicable thereto.

What is claimed is:

1. A method of manufacturing semiconductor devices, comprising:

conducting a manufacturing procedure on a plurality of working substrates with a plurality of shot areas arrayed on each of the working substrates, a predetermined number of the working substrates implementing one of a plurality of lots, wherein the lots, the working substrates and the shot areas implement a testing-hierarchy of testing-position levels;

classifying the lots into a plurality of groups, each of the groups having a different set of testing positions along the testing-position levels in the testing-hierarchy, each of the groups including a plurality of wafers;

creating a test recipe of a subject group to be tested next to a previous group based on analysis information of a variation of defects in a specified testing-position level in the previous group, the test recipe including a set of testing-position levels in the subject group defined by a rule with different set of numbers of the testing positions in each of the testing-position levels from the previous group;

assigning a plurality of testing apparatuses to each of the groups, according to test recipes created for each of the groups; and testing defects in the subject group based on the test recipe.

2. The method of claim 1, wherein the test recipe is created for the subject group based on a distribution of defects of the previous group.

3. The method of claim 1, wherein:

classifying the lots into the groups is based on identification numbers attached to the lots.

4. The method of claim 1, wherein one of the testing apparatuses measures dimensions of patterns formed on working substrates in the lots.

5. The method of claim 1, wherein one of the testing apparatus includes one of a microscope, an interference-type film thickness gauge, an ellipsometer, a contact-type film thickness gauge, and a resistance meter.

6. The method of claim 1, wherein each of the shot areas is further divided into a plurality of small-area sites so as to implement a further lower testing-position level under the testing-position level of the shot areas in the testing-hierarchy.

7. The method of claim 6, wherein each of the small-area sites is further divided into a plurality of areas of patterns so as to implement a further lower testing-position level under the testing-position level of the small-area sites in the testing-hierarchy.

* * * * *